United States Patent
Lo

(10) Patent No.: US 11,778,773 B2
(45) Date of Patent: Oct. 3, 2023

(54) CHOKE STRUCTURE WITH WATER COOLING

(71) Applicant: PHIHONG TECHNOLOGY CO., LTD., Taoyuan (TW)

(72) Inventor: Kao-Ping Lo, Taoyuan (TW)

(73) Assignee: PHIHONG TECHNOLOGY CO., LTD., Taoyuan (TW)

( * ) Notice: Subject to any disclaimer, the term of this patent is extended or adjusted under 35 U.S.C. 154(b) by 392 days.

(21) Appl. No.: 17/198,799

(22) Filed: Mar. 11, 2021

(65) Prior Publication Data
US 2022/0192052 A1 Jun. 16, 2022

(30) Foreign Application Priority Data
Dec. 15, 2020 (TW) ................ 109216548

(51) Int. Cl.
| | |
|---|---|
| *H05K 7/20* | (2006.01) |
| *H05K 7/14* | (2006.01) |
| *H05K 5/04* | (2006.01) |
| *H01F 17/00* | (2006.01) |

(52) U.S. Cl.
CPC .......... *H05K 7/20218* (2013.01); *H05K 5/04* (2013.01); *H05K 7/1427* (2013.01); *H05K 7/2039* (2013.01); *H01F 17/00* (2013.01); *H01F 2017/0093* (2013.01)

(58) Field of Classification Search
CPC ... H01F 17/00; H01F 2017/0093; H05K 5/04; H05K 7/1427; H05K 7/20218; H05K 7/2039
See application file for complete search history.

(56) References Cited

U.S. PATENT DOCUMENTS

| | | | | |
|---|---|---|---|---|
| 9,788,410 | B2* | 10/2017 | Uchiyama | H05K 7/1432 |
| 2003/0067749 | A1* | 4/2003 | Tamba | H05K 7/20927 |
| | | | | 165/80.4 |
| 2004/0189430 | A1* | 9/2004 | Matsutani | H01F 27/027 |
| | | | | 336/83 |
| 2006/0044103 | A1* | 3/2006 | Roebke | H01F 27/10 |
| | | | | 336/208 |
| 2009/0002110 | A1* | 1/2009 | Ahangar | H01F 27/266 |
| | | | | 336/60 |
| 2017/0221793 | A1* | 8/2017 | Smalley | H01L 25/0655 |
| 2017/0338025 | A1* | 11/2017 | Benzerrouk | H01F 27/022 |
| 2019/0339026 | A1* | 11/2019 | Chen | F28F 9/0246 |
| 2019/0343018 | A1* | 11/2019 | Chen | F28D 1/0233 |

* cited by examiner

*Primary Examiner* — Jacob R Crum
(74) *Attorney, Agent, or Firm* — Muncy, Geissler, Olds & Lowe, P.C.

(57) ABSTRACT

A choke structure with water cooling includes a water-cooled device, a choke assembly mounted on the water-cooled device, a ceramic heat spreader with high thermal conductivity set between the choke assembly and the water-cooled device, a metal housing having upper and lower openings installed on the water-cooled device to surround the choke assembly and the ceramic heat spreader with high thermal conductivity, and a printed circuit board is arranged on the upper opening of the metal housing, wherein the generated heat while operating the choke assembly is transmitted through a first heat conduction path formed by the ceramic heat spreader with high thermal conductivity in contact with the choke assembly and the water-cooled device for dissipating heat.

20 Claims, 2 Drawing Sheets

CHOKE STRUCTURE WITH WATER COOLING

TECHNICAL FIELD

The present invention relates to a choke structure, and more particularly, a choke structure with water cooling.

BACKGROUND

With the widespread application of power electronic systems, such as solar inverters, medium/high voltage inverters, uninterruptible power systems (UPS), and power management, the heat dissipation of power electronic systems has also received increasing attention.

Magnetic components are key components in power electronic systems. Their main functions include isolation, limitation of short-circuit current, reactive power compensation and smoothing. One type of electrical components includes inductors having choke structure, which are magnetic iron cores of electromagnetic devices with magnetic iron cores, usually made of ferromagnetic metal with multiple turns of coil windings. These include transformers, choke coils structure, and many other devices that use such electromagnetic components.

In the prior arts, many solutions for cooling such equipment include air cooling and the placement of heat sink assemblies attached to heat sinks. Traditional air-cooled inductors with choke structure have low efficiency of their volume heat dissipation (volumetrically inefficient) and require a large surface area to dissipate heat. However, these components are usually large in size and have considerable weight. The sealed housing equipped with a large-size inductor cannot sufficiently dissipate heat by air cooling alone.

In liquid cooling equipment, several methods have been used. These methods include wrapping a liquid cooling tube in an iron core around which a coil is wound. In some cases, the coil is immersed in the liquid inside its housing. In any method, care must be taken not to short-circuit the coil or reduce inductance or other electrical properties for adding a cooling system.

Therefore, how to effectively improve the heat dissipation efficiency is an important topic in the design of electrical equipment with inductive components.

SUMMARY OF THE INVENTION

For the aforementioned purpose, the present invention proposes a choke structure with water cooling to improve the heat dissipation capacity of the choke structure, thereby solving the difficulties mentioned in the prior art.

A choke structure with water cooling includes a water-cooled device, a choke assembly mounted on the water-cooled device, a ceramic heat spreader with high thermal conductivity set between the choke assembly and the water-cooled device, a metal housing having upper and lower openings installed on the water-cooled device to surround the choke assembly and the ceramic heat spreader with high thermal conductivity, and a printed circuit board is arranged on the upper opening of the metal housing, wherein the generated heat while operating the choke assembly is transmitted through a first heat conduction path formed by the ceramic heat spreader with high thermal conductivity in contact with the choke assembly and the water-cooled device for dissipating heat.

In one preferred embodiment, there is an electrically insulating spacer installed between the printed circuit board and the upper opening of the metal housing.

In one preferred embodiment, the choke assembly is installed in an accommodating space formed by the electrically insulating spacer, the metal housing, and the ceramic heat spreader with high thermal conductivity.

In one preferred embodiment, the choke assembly includes one or more than one choke components.

In one preferred embodiment, the choke structure with water cooling further comprising a thermally conductive gap filler filled in gaps between the choke assembly and the accommodating space, wherein heat generated while the choke assembly is operated is dissipating through a second heat conducting path formed by the thermally conductive gap filler, the metal housing, and the water-cooled plate in contact with the metal housing.

In one preferred embodiment, the thermally conductive gap filler is a thermally conductive silicone, which has a thermal conductivity of approximately 5 W/(m·K).

In one preferred embodiment, the printed circuit board has electronic components installed, the electronic components including control ICs, switches, resistors, and capacitors.

In one preferred embodiment, the ceramic heat spreader is an aluminum nitride (AlN) substrate, which has a thermal conductivity of approximately 200 W/(m·K).

In one preferred embodiment, the water-cooled device comprises a high thermal conductivity metal base with a plurality of hollow paths parallelly formed inside it, and a metal tube with high thermal conductivity been bended to pass through the plurality of hollow paths and closely contact with the high thermal conductivity metal base to form a winding cooling path, allowing cooling water to circulate inside the metal tube, In one preferred embodiment, the high thermal conductivity metal base is composed of oxygen-free copper.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

The present invention proposes a water-cooled choke structure to improve the heat dissipation capability of the inductor structure, thereby solving the difficulties mentioned in the prior art.

Figure 1:
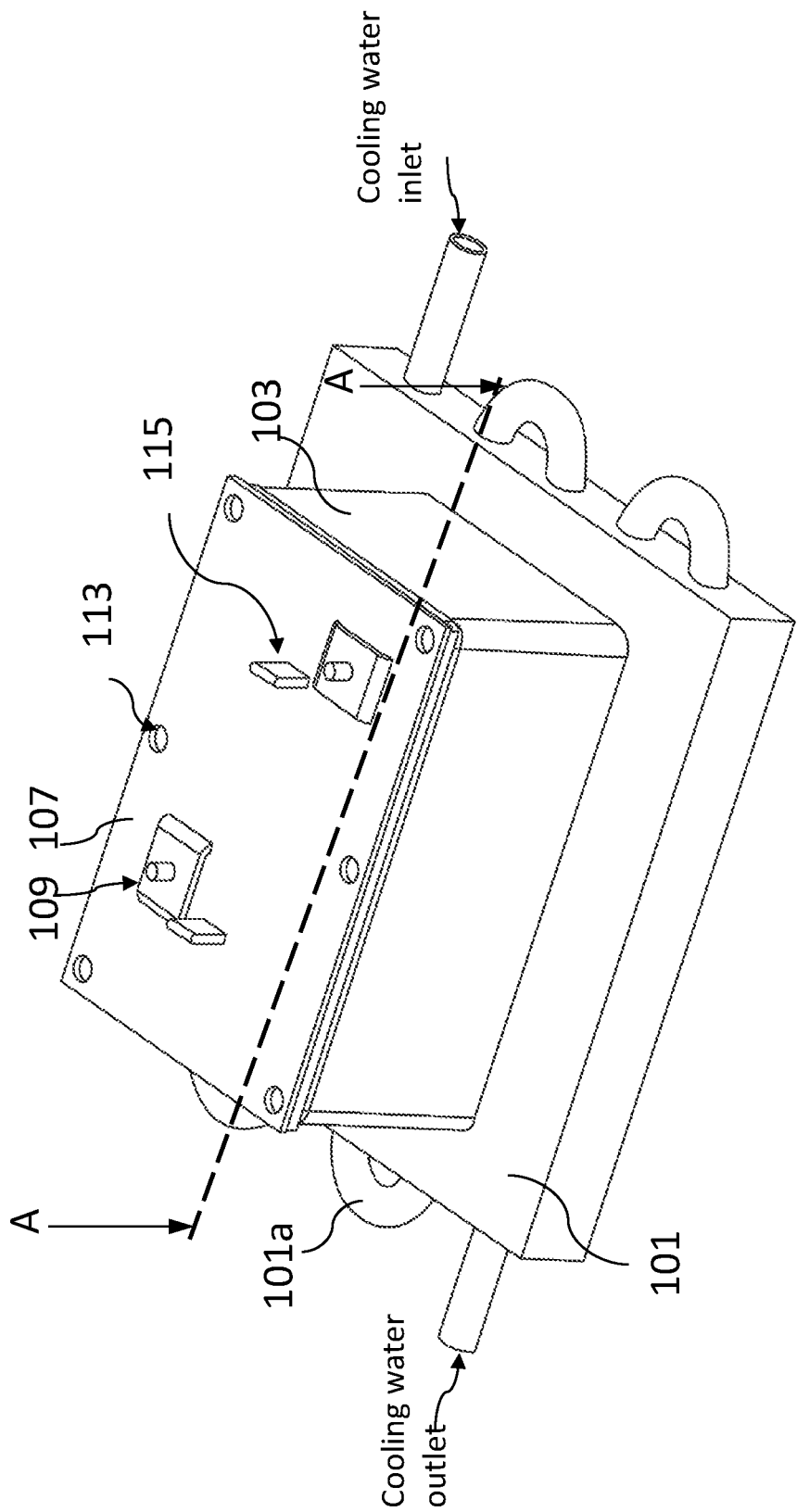
FIG. 1 illustrates a three-dimensional view of the choke structure with a water-cooling design according to a preferred embodiment of the present invention.

Please refer to FIG. 1, which shows a three-dimensional view of the choke structure with a water-cooling design provided by the present invention. In the following descriptions, FIG. 1 and FIG. 2 should be referred at the same time. The above-mentioned water-cooled choke structure includes a water-cooled plate 101, a choke assembly 105 covered by an aluminum housing 103, and a printed circuit board (PCB) 107. In one embodiment, the water-cooled plate 101 is made of a high thermal conductivity metal base, such as oxygen-free copper, having a plurality of hollow paths (not shown) parallelly formed inside the base, and then a metal tube with high thermal conductivity 101a, such as oxygen-free copper tube, is bended to pass through these hollow paths and closely contacts the high thermal conductivity metal base to form a winding path, so that cooling water can be circulating inside the high thermal conductivity metal tube (flow into the cooling water inlet and come out from the outlet) to form a winding cooling path. In one embodiment, the choke assembly 105 composed of one or more than one choke components 105a is surrounded by an aluminum housing 103 with upper and lower openings, and the aluminum housing 103 directly contacts the water-cooled plate 101. The printed circuit board 107 is installed on the upper opening of the aluminum shell and covers the choke assembly 105. The printed circuit board 107 is provided with electronic components 109, such as control integrated circuits (ICs), switches, resistors and capacitors, for operating the inductor assembly 105. An electrically insulating spacer 111, such as bakelite, is installed between the printed circuit board 107 and the choke assembly 105 to electrically isolate the inductor assembly 105 and the electronic components 109 on the printed circuit board 107. Both the printed circuit board 107 and the electrically insulating spacer 111 have a plurality of screw holes 113 and notches/slots 115 for mounting the printed circuit board 107 on the aluminum housing 103 and engaging with the inductance component 105, respectively. In one embodiment, a ceramic heat spreader 117 with high thermal conductivity is provided between the bottom of the inductor assembly 105 and the water-cooling plate 101. In addition to dissipating the heat generated by the choke assembly 105 into the water-cooled plate 101 via the ceramic heat spreader 117, which can also provide electrical insulation between the choke assembly 105 and the water-cooled plate 101. Besides in contact with the water-cooled plate 101, the ceramic heat spreader 117 is also in contact with the aluminum housing 103.

Figure 2:
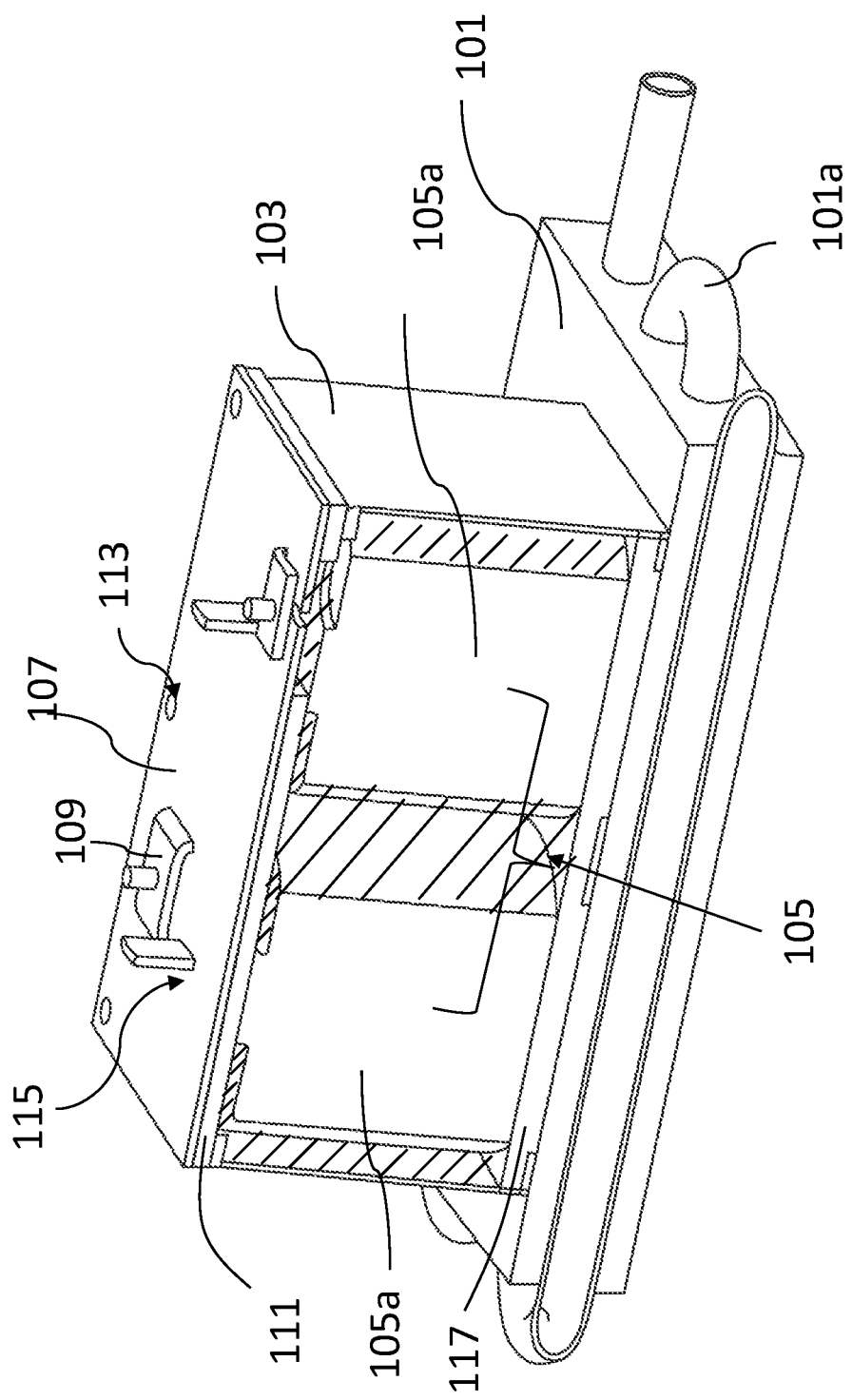
FIG. 2 illustrates a schematic cross-sectional view of the choke structure with water cooling design that is shown in FIG. 1 along the A-A direction according to a preferred embodiment of the present invention.

Referring to FIG. 2, it illustrates a schematic cross-sectional view of the choke structure with water cooling design that is shown in FIG. 1 along the A-A direction. Since the choke assembly 105 generates a large amount of heat during operation, in order to effectively dissipate the generated heat, the present invention installs a ceramic heat spreader 117 with high thermal conductivity, such as an aluminum nitride (AlN) substrate, between the bottom of the choke assembly 105 and the water-cooled plate 101, because the aluminum nitride substrate has a high thermal conductivity of about 200 W/(m·K), the heat accumulated at the bottom of the choke assembly 105 can be directly transferred to the water-cooled 101 plate. In a preferred embodiment, the contact surfaces between the bottom of the choke assembly 105 and the ceramic heat spreader 117, and the contact surfaces between the ceramic heat spreader 117 and the water-cooled plate 101 can be coated with a layer of thermal interface material, such as a layer of thermal grease, to enhance the efficiency of heat dissipation. The gaps between the choke components of the choke assembly 105, between the choke assembly and the aluminum housing, and between the choke assembly and the bakelite are filled and cured with a thermally conductive gap filler (FIG. 2 slashed area), for example thermally conductive silicone, which has a thermal conductivity of approximately 5 W/(m·K). Therefore, the heat generated from other portion of the choke assembly 105, except for the bottom part, can be transferred to the aluminum housing 103 from the separate elements via the thermally conductive gap filler, and then transferred to the water-cooled plate 101 to be taken away by the cooling water, which in effect enhances the efficiency and life-time of the heat-generating electronic components.

The design of inductor device structure proposed in the present invention has the following advantages:

1. By installing a ceramic heat spreader with high thermal conductivity between the bottom of the inductor assembly and the water-cooled plate, an efficient heat dissipating path and an electrical insulator are provided.

2. By filling a thermally conductive gap filler with relatively higher thermal conductivity than air in the space enclosed by the inductor assembly and other components, an effective heat dissipating path for other portion of the inductor assembly is provided.

As will be understood by persons skilled in the art, the foregoing preferred embodiment of the present invention illustrates the present invention rather than limiting the present invention. Having described the invention in connection with a preferred embodiment, modifications will be suggested to those skilled in the art. Thus, the invention is not to be limited to this embodiment, but rather the invention is intended to cover various modifications and similar arrangements included within the spirit and scope of the appended claims, the scope of which should be accorded the broadest interpretation, thereby encompassing all such modifications and similar structures. While the preferred embodiment of the invention has been illustrated and described, it will be appreciated that various changes can be made without departing from the spirit and scope of the invention.

What is claimed is:

1. A choke structure with water cooling comprising:
   a water-cooled device;
   a choke assembly mounted on the water-cooled device;
   a ceramic heat spreader with high thermal conductivity set between the choke assembly and the water-cooled device;
   a metal housing having upper and lower openings installed on the water-cooled device to surround the choke assembly and the ceramic heat spreader with high thermal conductivity; and
   a printed circuit board is arranged on the upper opening of the metal housing, wherein the generated heat while operating the choke assembly is transmitted through a first heat conduction path formed by the ceramic heat spreader with high thermal conductivity in contact with the choke assembly and the water-cooled device for dissipating heat.

2. The choke structure with water cooling of claim 1, further comprising an electrically insulating spacer installed between the printed circuit board and the upper opening of the metal housing.

3. The choke structure with water cooling of claim 2, wherein the choke assembly is installed in an accommodating space formed by the electrically insulating spacer, the metal housing, and the ceramic heat spreader with high thermal conductivity.

4. The choke structure with water cooling of claim 3, wherein the choke assembly includes one or more than one choke components.

5. The choke structure with water cooling of claim 4, further comprising a thermally conductive gap filler filled in gaps between the choke assembly and the accommodating space, wherein heat generated while operating the choke assembly is dissipating through a second heat conducting path formed by the thermally conductive gap filler, the metal housing, and the water-cooled plate in contact with the metal housing.

6. The choke structure with water cooling of claim 5, wherein the thermally conductive gap filler is formed by filling and curing a thermally conductive silicone, which has a thermal conductivity of approximately 5 W/(m·K).

7. The choke structure with water cooling of claim 1, wherein the printed circuit board has electronic components installed, the electronic components including control ICs, switches, resistors, and capacitors.

8. The choke structure with water cooling of claim 1, wherein the ceramic heat spreader is an aluminum nitride (AlN) substrate, which has a thermal conductivity of approximately 200 W/(m·K).

9. The choke structure with water cooling of claim 1, wherein the water-cooled device comprising:
a high thermal conductivity metal base with a plurality of hollow paths parallelly formed inside it; and
a metal tube with high thermal conductivity bent to pass through the plurality of hollow paths and closely contact with the high thermal conductivity metal base to form a winding cooling path, allowing cooling water to circulate inside the metal tube.

10. The choke structure with water cooling of claim 9, wherein the high thermal conductivity metal base is composed of oxygen-free copper.

11. A choke structure with water cooling comprising:
a water-cooled device;
a choke assembly mounted on the water-cooled device;
a ceramic heat spreader with high thermal conductivity set between the choke assembly and the water-cooled device, wherein the ceramic heat spreader is an aluminum nitride (AlN) substrate, which has a thermal conductivity of approximately 200 W/(m·K);
a metal housing having upper and lower openings installed on the water-cooled device to surround the choke assembly and the ceramic heat spreader with high thermal conductivity; and
a printed circuit board is arranged on the upper opening of the metal housing, wherein the generated heat while operating the choke assembly is transmitted through a first heat conduction path formed by the ceramic heat spreader with high thermal conductivity in contact with the choke assembly and the water-cooled device for dissipating heat; and
an electrically insulating spacer installed between the printed circuit board and the upper opening of the metal housing.

12. The choke structure with water cooling of claim 11, wherein the choke assembly is installed in an accommodating space formed by the electrically insulating spacer, the metal housing, and the ceramic heat spreader with high thermal conductivity.

13. The choke structure with water cooling of claim 12, wherein the choke assembly includes one or more than one choke components.

14. The choke structure with water cooling of claim 13, further comprising a thermally conductive gap filler filled in gaps between the choke assembly and the accommodating space, wherein heat generated while operating the choke assembly is dissipating through a second heat conducting path formed by the thermally conductive gap filler, the metal housing, and the water-cooled plate in contact with the metal housing.

15. The choke structure with water cooling of claim 14, wherein the thermally conductive gap filler is formed by filling and curing a thermally conductive silicone, which has a thermal conductivity of approximately 5 W/(m·K).

16. The choke structure with water cooling of claim 11, wherein the printed circuit board has electronic components installed, the electronic components including control ICs, switches, resistors, and capacitors.

17. The choke structure with water cooling of claim 11, wherein the water-cooled device comprising:
a high thermal conductivity metal base with a plurality of hollow paths parallelly formed inside it; and
a metal tube with high thermal conductivity bent to pass through the plurality of hollow paths and closely contact with the high thermal conductivity metal base to form a winding cooling path, allowing cooling water to circulate inside the metal tube.

18. The choke structure with water cooling of claim 11, wherein the high thermal conductivity metal base is composed of oxygen-free copper.

19. A choke structure with water cooling comprising:
a water-cooled device, wherein the water-cooled device comprising a high thermal conductivity metal base with a plurality of hollow paths parallelly formed inside it; and a metal tube with high thermal conductivity bent to pass through the plurality of hollow paths and closely contact with the high thermal conductivity metal base to form a winding cooling path, allowing cooling water to circulate inside the metal tube;
a choke assembly mounted on the water-cooled device;
a ceramic heat spreader with high thermal conductivity set between the choke assembly and the water-cooled device;
a metal housing having upper and lower openings installed on the water-cooled device to surround the choke assembly and the ceramic heat spreader with high thermal conductivity; and
a printed circuit board is arranged on the upper opening of the metal housing, wherein the generated heat while operating the choke assembly is transmitted through a first heat conduction path formed by the ceramic heat spreader with high thermal conductivity in contact with the choke assembly and the water-cooled device for dissipating heat; and
an electrically insulating spacer installed between the printed circuit board and the upper opening of the metal housing.

20. The choke structure with water cooling of claim 19, wherein the high thermal conductivity metal base is composed of oxygen-free copper.

* * * * *